(12) United States Patent
Anand et al.

(10) Patent No.: US 7,382,149 B2
(45) Date of Patent: Jun. 3, 2008

(54) SYSTEM FOR ACQUIRING DEVICE PARAMETERS

(75) Inventors: Darren L. Anand, Essex Junction, VT (US); Nazmul Habib, South Burlington, VT (US); Robert J. McMahon, Essex Junction, VT (US); Troy J. Perry, Georgia, VT (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 11/459,367

(22) Filed: Jul. 24, 2006

(65) Prior Publication Data
US 2008/0018356 A1 Jan. 24, 2008

(51) Int. Cl.
*G01R 31/26* (2006.01)
(52) U.S. Cl. .................................................. 324/769
(58) Field of Classification Search ................ 324/769, 324/765, 763, 760, 158.1; 702/35, 36, 85, 702/106, 182, 117; 714/724
See application file for complete search history.

(56) References Cited

U.S. PATENT DOCUMENTS 6,784,686 B2 *  8/2004  Nishida et al. ............. 324/765
7,299,389 B2 * 11/2007  Nishida et al. ............. 714/724

* cited by examiner

*Primary Examiner*—Ha Nguyen
*Assistant Examiner*—Tung X Nguyen
(74) *Attorney, Agent, or Firm*—W. Riyon Harding

(57) ABSTRACT

A system for performing device-specific testing and acquiring parametric data on custom integrated circuits, for example ASICs, such that each chip is tested individually without excessive test time requirements, additional silicon, or special test equipment. The testing system includes a device test structure integrated into unused backfill space in an ASIC design which tests a set of dummy devices that are identical to some of those of the ASIC. The device test structure includes control logic for designating the type of test and which device types to activate (e.g. pFETs or nFETs), a protection circuit for protecting the SPM when the test is inactive, an isolation circuit for isolating the devices under test (DUT) from any leakage current during test, and a decode circuit for providing test input (e.g. voltages) to the DUT. By controlling which devices to test and the voltage conditions of those devices, the system calculates the relative product yield and health of the line on a die by die basis.

20 Claims, 8 Drawing Sheets

SYSTEM FOR ACQUIRING DEVICE PARAMETERS

CROSS REFERENCES RELATED TO THE APPLICATION

None

BACKGROUND OF THE INVENTION

1. Field of the Invention

The invention relates to the field of acquiring manufacturing process data on a part-by-part basis, and more specifically, to providing a means to acquire part-specific data to perform a detailed analysis of semiconductor products so that the analysis can be used to tune the manufacturing processes.

2. Background of the Invention

Due to the complex and precise nature of semiconductor manufacturing, it is critical to ensure that all processes within the manufacturing line are within required specifications in order to have the highest product yield. Monitoring the manufacturing process and correcting for deficiencies is critical for maintaining the health of the line (HOL).

Some testing is done in-line during manufacturing to tune the process real-time, and other tests are performed after manufacturing. Kerf testing is a common type of testing and provides information for a group of die on a wafer relating to process, voltage, and temperature (PVT). Other tests include: I/O receiver/driver levels, performance screen ring oscillator (PSRO) testing, and MUX scan testing, also known as "at speed" testing.

The problem with kerf testing is that it does not provide detailed information specific to each die on the wafer and further, cannot provide information about the electrical parameters of certain devices within each of the chips; especially custom designs which have smaller manufacturing lot sizes, varying device dimensions from standard devices, and other product-specific qualities.

Since in-line testing is time consuming and expensive, it is important to perform adequate testing within a minimal amount of time. Generally, testing is done by sampling a set of kerfs to obtain an overall HOL measurement. For customized circuits, such as application specific integrated circuits (ASIC) testing by sampling does not provide an accurate assessment of device parameters within each die of the wafer, which is critical for improving yield and ensuring that customer requirements and delivery expectations are met.

BRIEF SUMMARY OF THE INVENTION

Based on the issues identified above, what is needed is a means for accurately testing customized circuitry so that adequate feedback can be relayed to the manufacturing line to ensure the highest possible yields. It is a further requirement that the testing means does not take an exceptional amount of time, nor take excessive silicon real estate and therefore, affect cost. The testing means must be adaptable to meet specific testing requirements without providing unnecessary test structure overhead.

The present invention is a circuit architecture, which is placed into a physical integrated circuit design, typically in the backfill, and is adapted to provide accurate electrical and physical measurements of the circuit on that particular die. The circuit is referred to throughout the specification as a scalable parametric measurement (SPM) macro. The SPM macro includes a logic controller having a decoder for activating one or more device under test (DUT) structures, a decode level translator which provides a required logic level or required voltage to one or more DUT structures, and a protection circuit which isolates the integrated circuit when the test system is inactive.

The circuit may operate in either a single or dual supply mode. In the single supply mode, during wafer final test (WFT) and/or module final test (MFT), the current ($I_{on}$) measurement for each DUT is calculated and recorded. In dual supply mode, the circuit controls the voltage to a DUT gate, for example, as well as provides power to the DUT source and/or drain.

Measurements for threshold voltage ($V_t$), $I_{on}$, and effective current ($I_{eff}$) for each DUT are then calculated and recorded.

The SPM macro integrates a device performance monitor within ASIC chips. The macro represents all device types and design points used on an ASIC chip. SPM may be integrated with the existing electronic chip identification macro (ECID: used at IBM), which is guaranteed to be on every ASIC chip, or the SPM may be placed as a standalone macro.

SPM macro provides several unique, user-defined device tests. All tests include measuring and recording applicable parameters of on-chip devices such as average $I_{on}$, $V_t$, and $I_{eff}$ pertaining to an array of FETs. The tests account for spatial variations. Each device under test (DUT) in this specification refers to but is not limited to nFET and pFET devices. DUTs may also be wires, resistors, capacitors, inductors, and other circuit components. Additionally, across chip variation (ACV) data can be extracted and analyzed by placing multiple SPM macros on a single chip.

During release checking, all device types and design points on a particular ASIC chip will be determined and matched with those present in the SPM.

If the SPM macro contains device types that are not part of the ASIC design, then those types will be ignored during physical processing, meaning special masks will not be generated to support devices existing solely in the SPM macro. In this case, the unused devices will be processed with standard threshold devices on chip. Device information describing what is on the chip will be relayed to the test engineers, and SPM DUTs ignored during the processing step will not be included at test.

The existing ECID macro contains a fatwire I/O with very low-resistance requirements (<10 Ohms guaranteed). This fatwire I/O will be connected to a Precision Measurement Unit (PMU) which will be used for accurate voltage force, current measure activity. SPM may share this fatwire I/O to attain its PMU.

Determination for minimum number of required SPM macros per chip can be defined and adhered to during the chip design process. Metrics such as distance from the fatwire I/O, proximity to performance screen ring oscillator circuits (PSRO: used to guarantee product performance), and minimum distances between SPM macros should be defined.

DETAILED DESCRIPTION OF THE INVENTION

Figure 1:
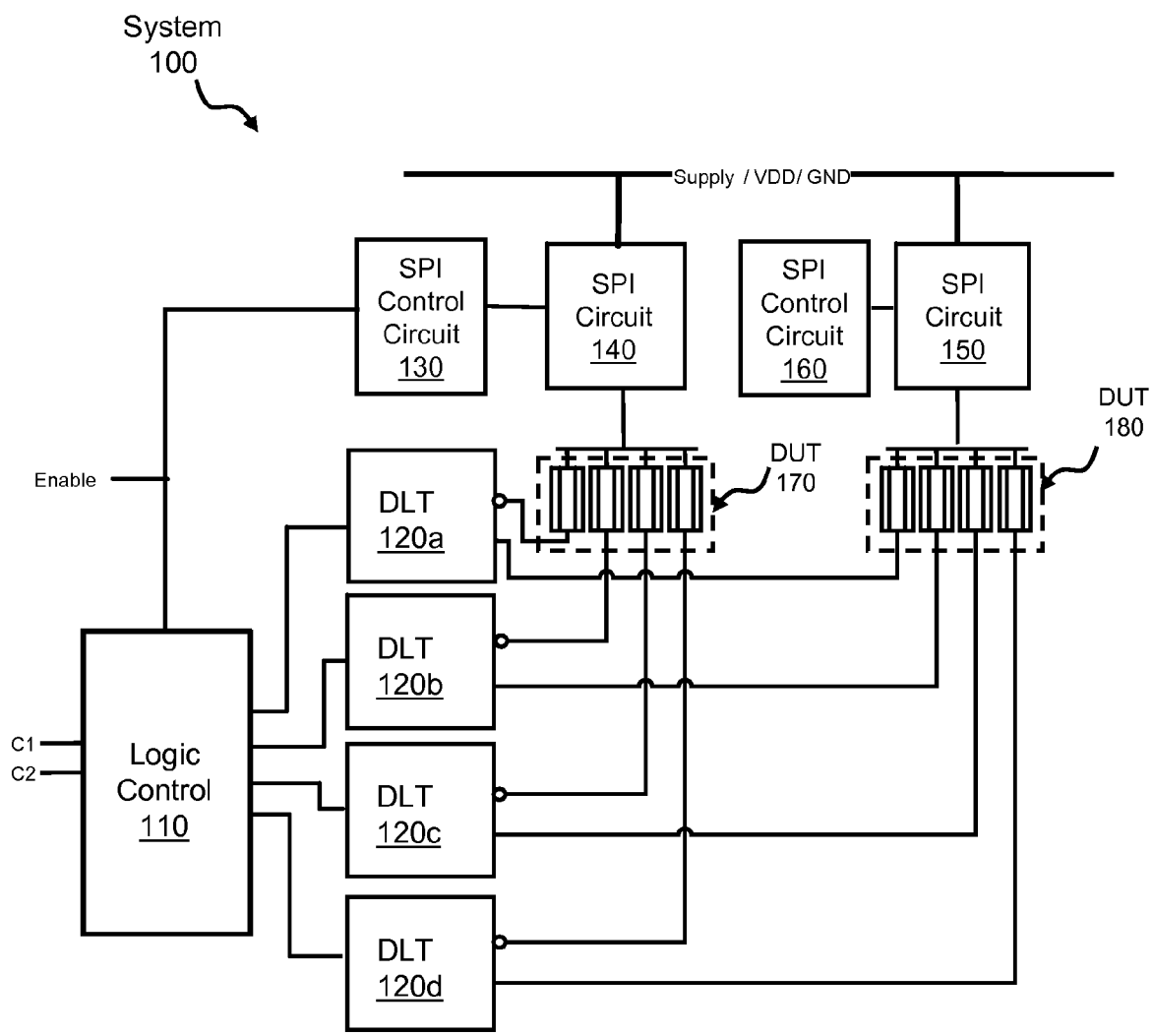
FIG. 1 is a system level block diagram of an SPM circuit.

FIG. 1 shows an SPM macro 100 of the present invention. SPM macro 100 includes a logic control 110, a group of decode level translators (DLT) 120a-d (four DLTs are shown in this example), a pFET SPI circuit 140 coupled to an SPI control circuit 130, and a DUT 170, which represents one device type (in this example, an array of pFETs). SPM macro 100 further includes a nFET SPI circuit 150 coupled to SPI control circuit 160 and a DUT 180, which represents a second device type (in this example, an array of nFETs).

Figure 2:
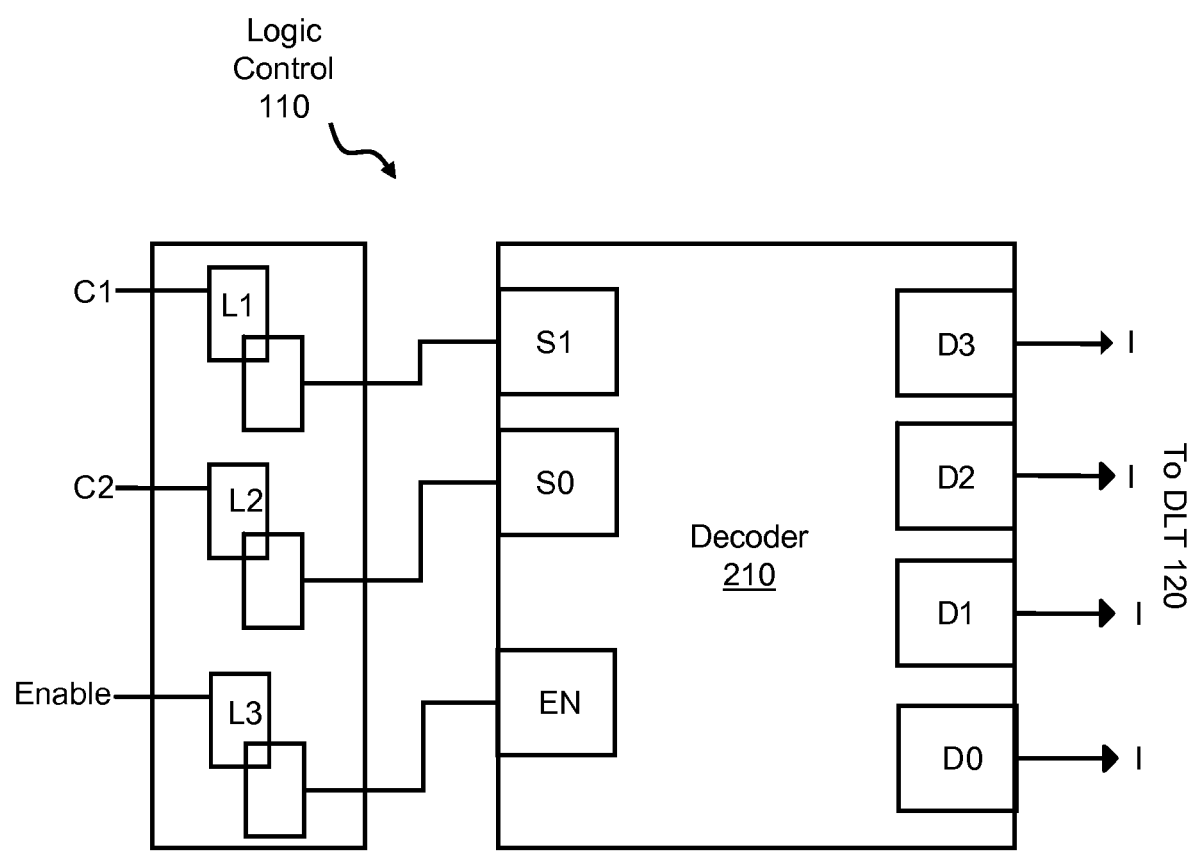
FIG. 2 is a block diagram of the logic control.

FIG. 2 shows logic control 110, which includes a control signal C1 coupled to a latch L1, which is further connected to a pad S1 of a decoder 210. Control signal C2 is coupled to a latch L2, the output of which is coupled to a pad S0 of decoder 210. An enable signal, EN, is coupled to a third latch L3, the output of which is coupled to a pad EN of decoder 210. Decoder 210 further comprises a series of outputs D0-D3, which are each coupled to DLT 120a-d respectively.

Logic control 110 enables each DUT 170 or 180 to be activated individually for test. Decoder 210 is shown in FIG. 2 as a 2:4 decoder for illustrative purposes but need not be limited to a 2:4 decoder. Since DUT 170 and DUT 180 experiments are separated, decoder 210 behaves as a 2 to 8 decoder, controlling DUT 170 and DUT 180 with each decoder output. Typical decode sizes will be 4:16 or 5:32, which will achieve capability of controlling 32 to 64 DUTs. If EN is low, decoder 210 outputs D0-D3 will be low, which ensures all DUT 170 and DUT 180 gates are off.

Figure 3:
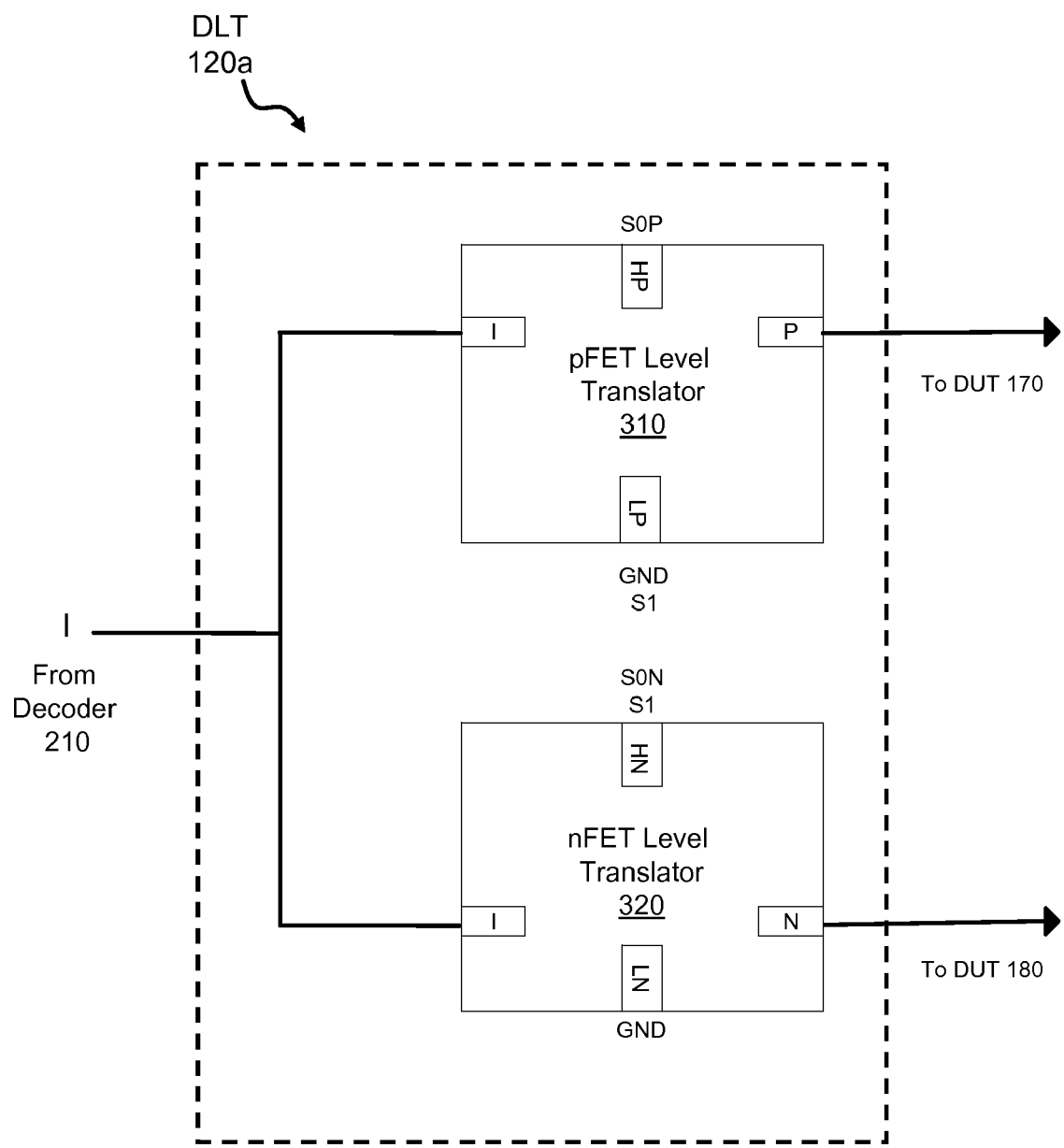
FIG. 3 is a block diagram of the decode level translator (DLT).

FIG. 3 shows a detailed diagram of DLT 120a. DLT 120a is exemplary of any of DLT 120b-d and thus will serve to explain DLT 120 functionality and structure by way of example. DLT 120a includes an input signal, I, from output D3 of decoder 210, a pFET level translator 310, and an nFET level translator 320. pFET level translator 310, further includes an input pad, I, an output pad, P, which is coupled to DUT 170, a second input pad, HP, and a third input pad, LP.nFET level translator 320 includes an input pad, I, which activates/deactivates DLT 120a, an output pad, N, which is coupled to DUT 180, a second input pad, HN, and a third input pad, LN.pFET level translator 310 and nFET level translator 320 are shown in detail in FIGS. 4 and 5 respectively.

In operation, input I to DLT 120a comes from decoder 210. When the output signal D3 from decoder 210, which is connected to the I pin of DLT 120a, is high, the P and N outputs of DLT 120a are active (i.e. N=1, and P=0), which turns on the associated DUT 170 gates, as well as the associated DUT 180 gates. The supply voltage inputs to DLT 120a are shown in Table 1 below.

TABLE 1 values of HP, LP, HN and LN for single and dual supply modes

|    | Single | Dual |
|----|--------|------|
| HP | S0P    | S0P  |
| LP | GND    | S1   |
| HN | S0N    | S1   |
| LN | GND    | GND  |

In Table 1, "single" supply represents DUT 170 and DUT 180 input from a single voltage source (S0P, S0N) which will drive simple logic 1's and 0's to DUT 170 and DUT 180 respectively.

In Table 1, "dual" represents input from two distinct voltage supplies where HN on nFET level translator 320 receives the signal S1 and LP on pFET level translator 310 also receives the signal S1.

In dual supply mode, S1 is sent to the gates of DUT 170 and 180 from outputs P and N respectively. S1 can be swept to determine the switching voltage ($V_{th}$) and FET current ($I_{ON}$) of DUT 170 and DUT 180.

In general, DLT 120 enables logic control 110 to control DUTs 170 and 180 residing in different voltage realms. DLT 120 provides a means for communication between two voltage domains including Vdd, supplied to control logic 110, and SPM "Supply/VDD/GND" used to generate S0 for DLT 120. The purpose of DLT 120 is to provide accurate logic levels and/or analog gate voltages to DUT 170 and DUT 180 in order to perform device level testing. In the case of BEOL characterization, either nFET level translator 320 or pFET level translator 310 will be used, depending on the FET type used to control DUT 120. Equalizing DUT experiments (equal n and p experiments) optimize use of the SPM.

Figure 4:
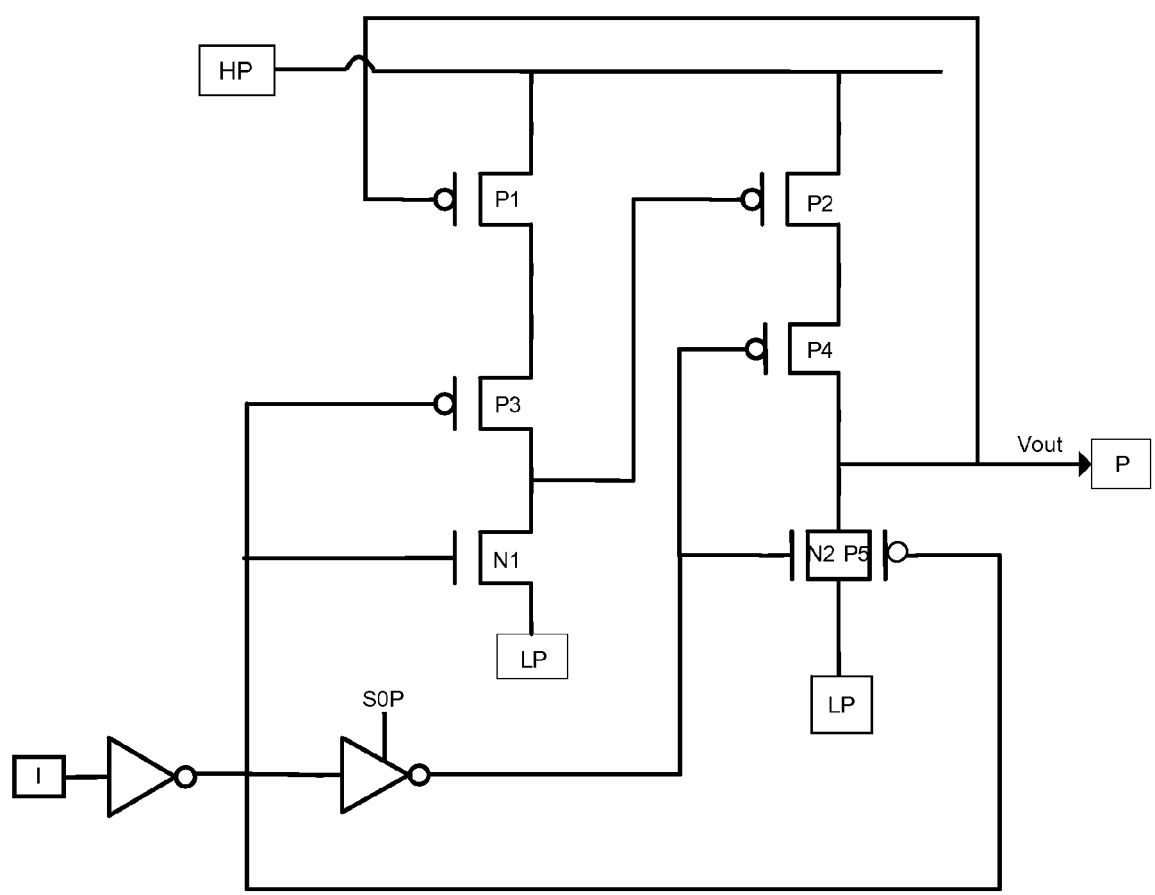
FIG. 4 is a schematic diagram of a pFET DLT (pDLT).

FIG. 4 shows a detailed schematic diagram of pFET level translator 310 which includes pFETs P1-P5, nFETs N1-N2, and a first inverter whose input is I. This inverter is serially connected to a second S0P powered inverter.

HP and LP are driven according to the type of test, as shown in Table 1. The output P is sent to DUT 170.

The input to pFET level translator 310 is inverted by the first inverter to achieve an opposite output state when enabled, which is required by pFETs associated with DUT 170. In a single supply application, e.g. applying S0P to HP, the output of pFET level translator 310 has the opposite logic level with respect to the input.

In a dual supply application, S1 is applied to LP. GND is replaced by S1 to allow voltage sweeping through a passgate, shown in FIG. 4 as FETs N2 and P5, to DUT 170 gates.

Figure 5:
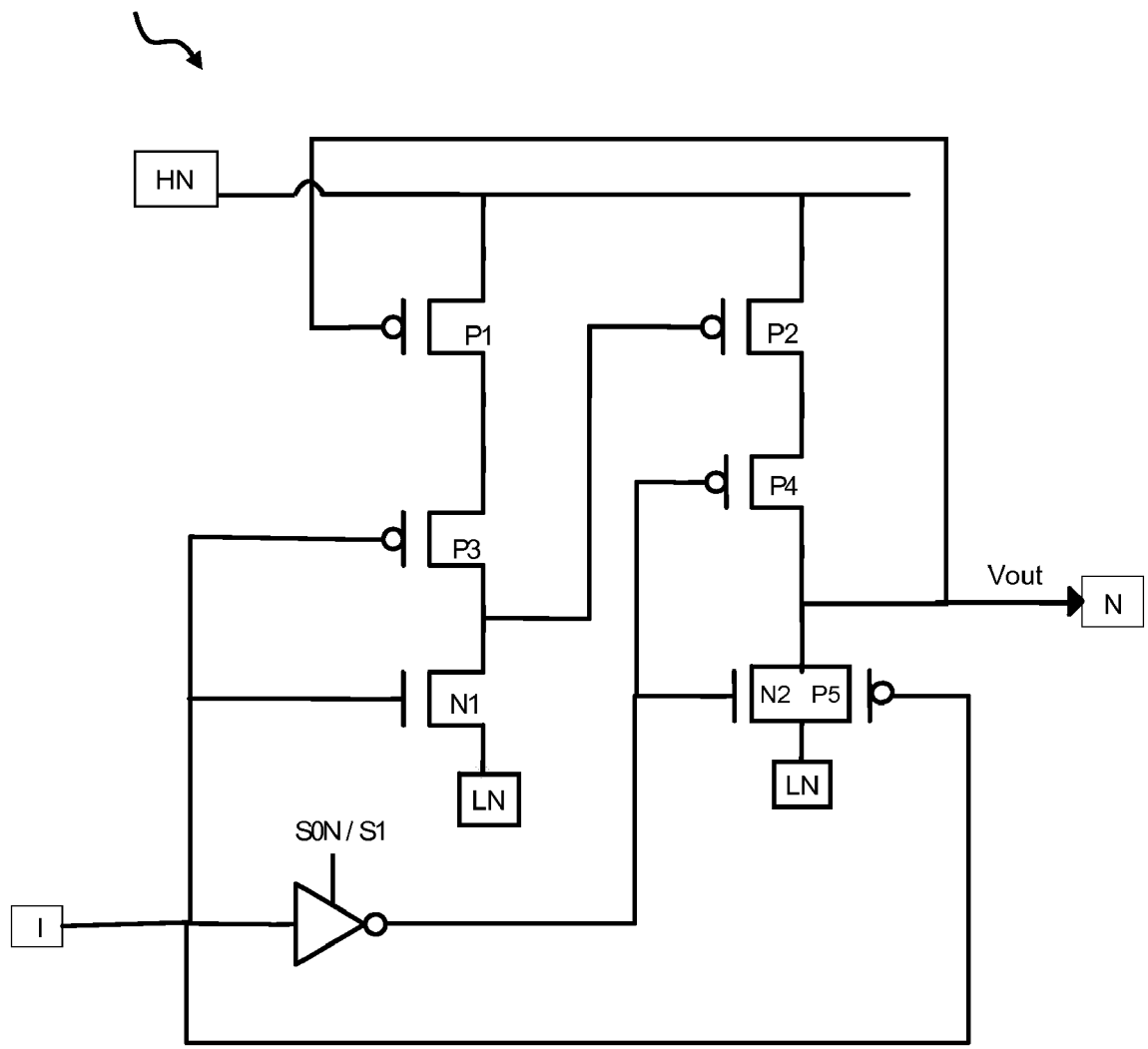
FIG. 5 is a schematic diagram of an nFET DLT (nDLT).

FIG. 5 shows a detailed schematic diagram of nFET level translator 320 which includes pFETs P1-P5, nFETs N1-N2, an inverter whose input is I, and is powered by either S0N or S1. HN and LN are driven according to the type of test, as shown in Table 1. The output N is sent to DUT 180.

nFET level translator 320 has an input which is non-inverting. The power supply for nFET level translator 320 may originate from a derivative of the entire SPM power supply (S0N), or from a separate power supply (S1). S1 controls analog gate voltages for DUT 180.

Figure 6:
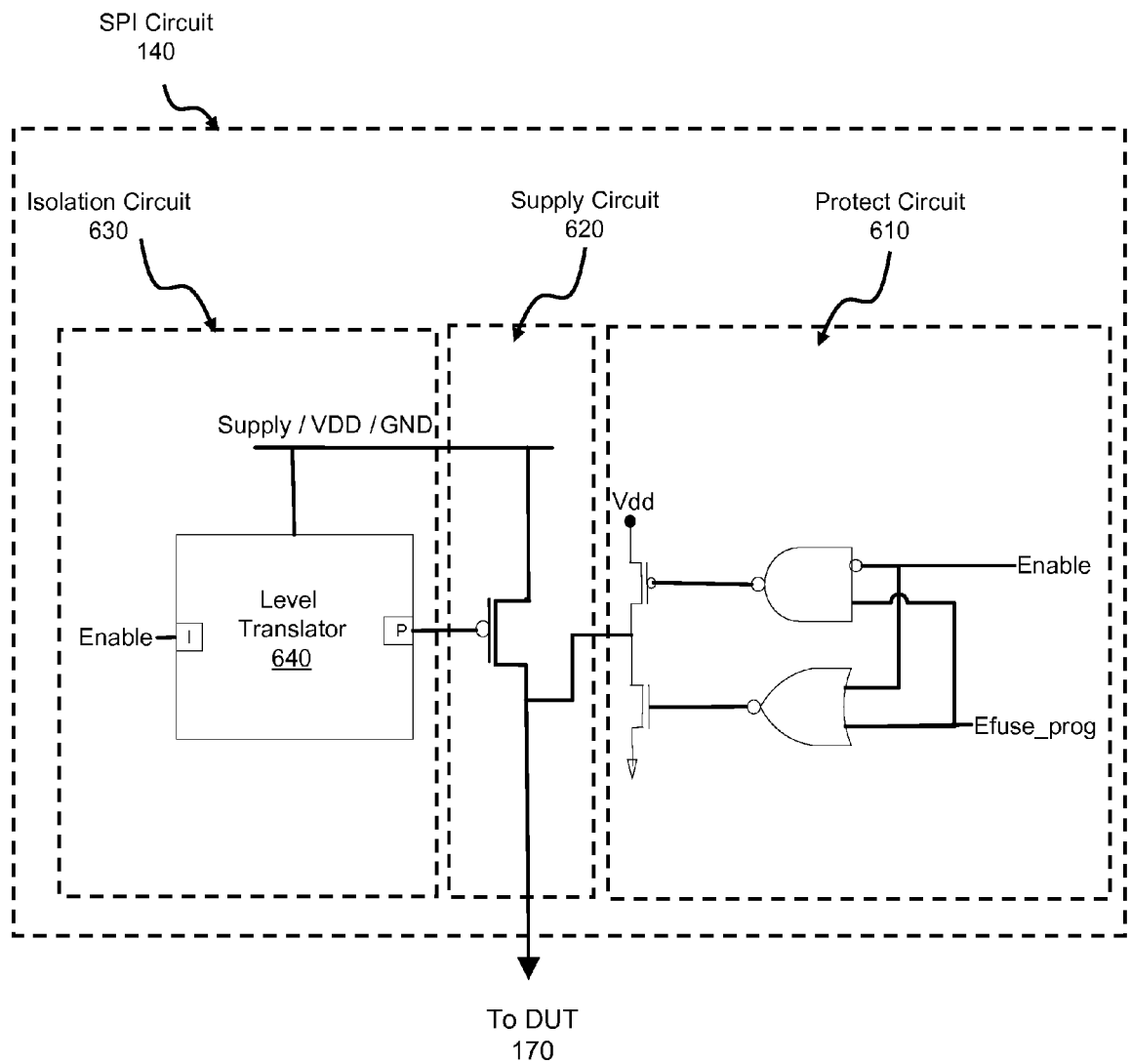
FIG. 6 is a schematic of a supply/protect/isolate (SPI) circuit.

FIG. 6 is a schematic block diagram of SPI circuit 140 which includes a protect circuit 610, a supply circuit 620, and an isolation circuit 630.

Isolation circuit 630 further includes level translator 640 having a supply/VDD/GND power supply, an enable input I, and an output P, which is coupled to a pFET of supply circuit 620. A detailed schematic diagram of isolation circuit 630 is shown in FIG. 7 and described below.

Figure 7:
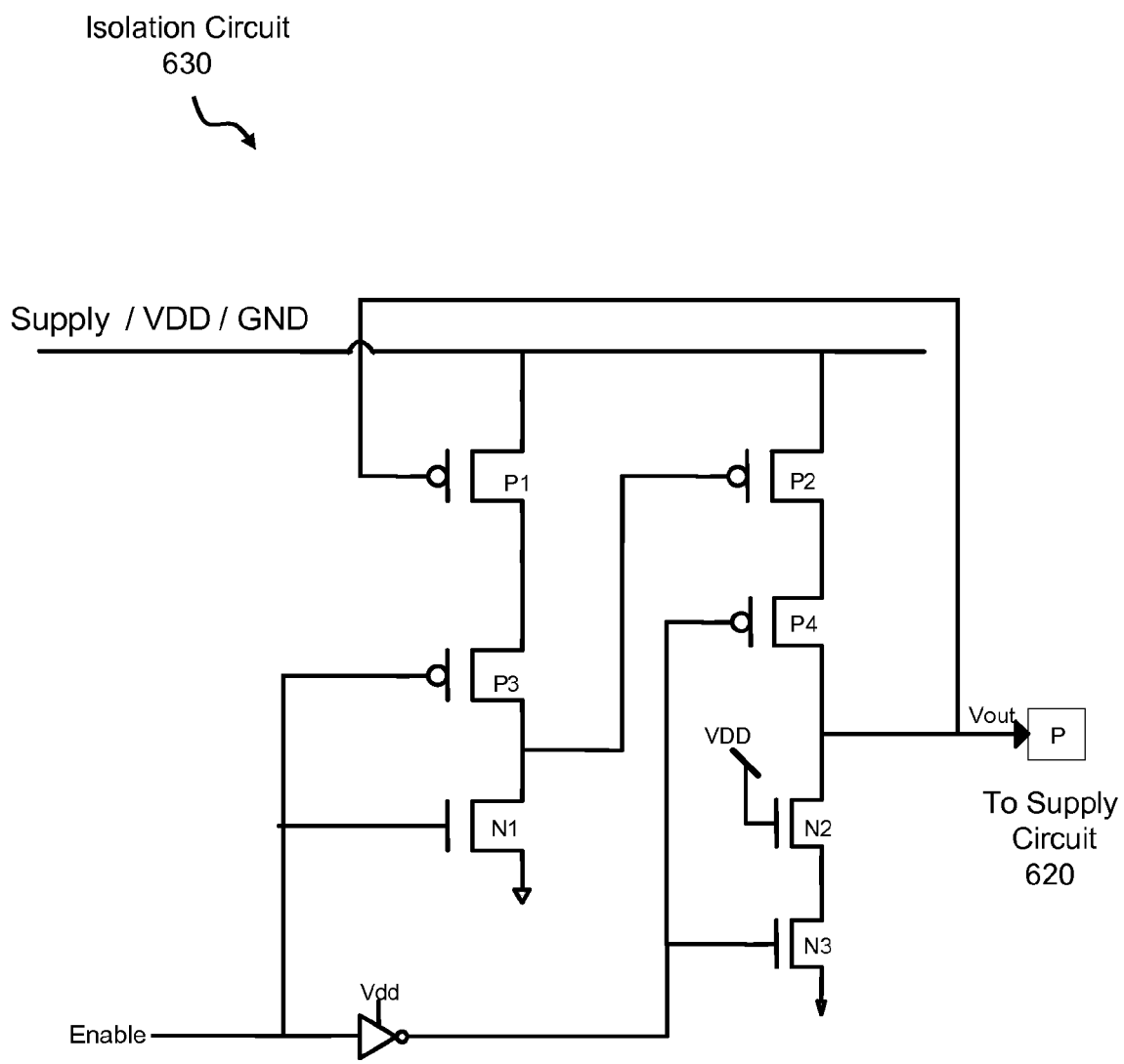
FIG. 7 is a detailed schematic diagram of the isolation circuit.

Level translator 640 of FIG. 7 includes pFETs P1-P4, nFETs N1-N3, and a Vdd powered inverter which has input I. Isolation circuit 630 electrically isolates DUT 170 so that the actual ASIC circuitry is not affected during test, nor is it affected by any leakage current from DUT 170 while the SPM is not in operation. Level translator 640 routes the supply voltage (Supply/VDD/GND) directly to the corresponding gate of the supply pFET in supply circuit 620 of FIG. 6.

Since the SPM separates nFET and pFET DUTs, it supplies each with a dedicated SPI structure. Only one of SPI circuits 140 or 150 is activated at a time. This is accomplished by selecting the appropriate SPI circuit 140 or 150 to activate using either SPI control circuit 130 or SPI control circuit 160 respectively. Although FIG. 6 shows SPI circuit 140, it is meant to be exemplary of any SPI circuit, including SPI circuit 150 and therefore SPI circuit 150 will not be discussed in further detail.

Figure 8A:
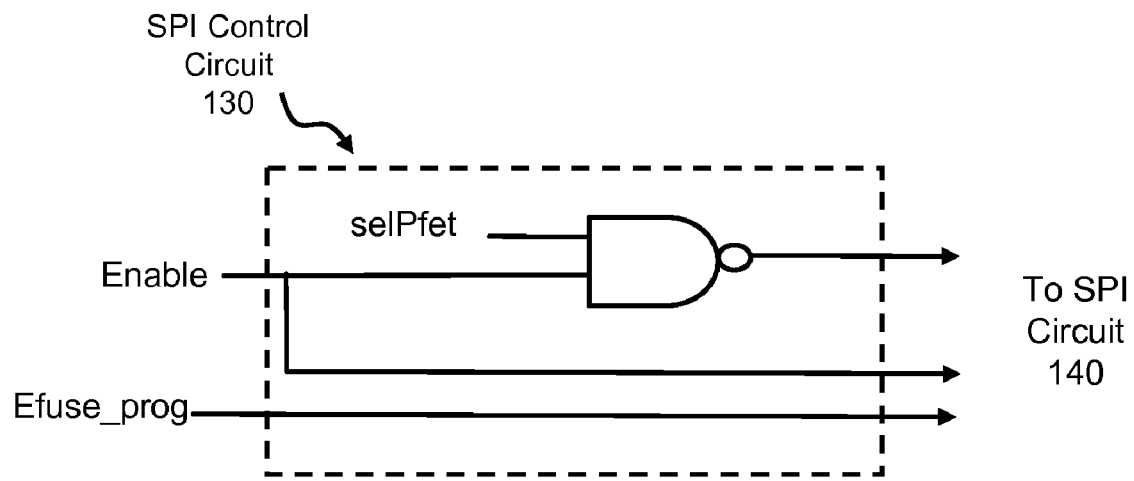
FIG. 8a is a logic diagram of an SPI control circuit for selecting pFET structures during test.
Figure 8B:
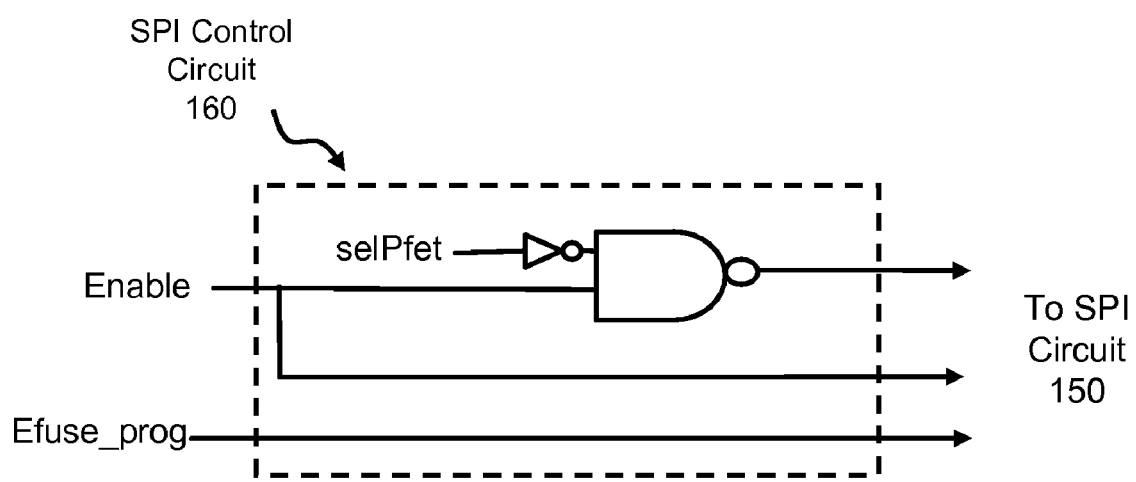
FIG. 8b is a logic diagram of an SPI control circuit for selecting nFET structures during test.

FIG. 8*a* shows a logic diagram of SPI control circuit 130 and FIG. 8*b* shows a logic diagram of SPI control circuit 160. SPI control circuit 130 further includes an Enable signal, an Efuse_prog signal, a selPfet signal, and a NAND gate having inputs from Enable and selPfet, which comes from a latch on the chip (not shown). The Enable, and Efuse_prog signal are further coupled to protect circuit 610. The NAND output directly feeds the I input of SPI circuit 140. By choosing only one SPI circuit at a time (using selPfet, and Enable), current through unused SPI circuit 150 is gated to reduce incidental leakage. Efuse_prog exists to protect non-SPM ASIC circuits (not shown). Since the SPM shares the Supply/VDD/GND pin with ASIC circuits, the existing Efuse_prog signal is used to isolate the SPM from other ASIC operations and vise versa.

The supply voltage is sourced through supply circuit 620. Supply circuit 620 includes a large supply pFET which sends an output signal to DUT 170.

The gate of the supply pFET is coupled to the output of isolation circuit 630, the source is connected to Supply/VDD/GND, and the drain is connected to the output of protect circuit 610. The supply pFET is sufficiently large to ensure it will have a minimum voltage drop during SPM measurements (<50 mV), but robust enough to handle high voltages, which may be at or above 3.0V.

SPI protect circuit 610 protects the supply pFET of supply circuit 620 from excessive source to drain, and gate to drain potential differences when high voltages are applied to Supply/VDD/GND (fatwire I/O). During high voltage applications, Supply=3.0 v and the SPM is inactive (off), i.e. all DUTs 170 and 180 are turned off. When Enable=0 and Efuse_prog=1, VDD is forced through protect circuit 610 and onto the drain of the supply pFET of supply circuit 620. The largest potential difference across the supply pFET is guaranteed to never be larger than Supply minus VDD. Simulation was completed to verify this voltage level is not damaging to the supply pFET.

In the single supply mode of operation either during wafer or module final test (WFT, MFT), a tester (not shown) calculates the current by measuring the background current ($I_{BG}$) and DUT current ($I_{MEAS}$) for each of DUT 170 and DUT 180. $I_{ON}$ is equal to the difference between $I_{MEAS}$ and $I_{BG}$ (i.e. $I_{ON}=I_{MEAS}-I_{BG}$). The tester records the $I_{ON}$ data for both DUT 170 and DUT 180. Table 2 shows a truth table for the Single Mode of operation used for controlling the SPM DUTs.

TABLE 2

Example truth table for single supply mode

| Input | | | | | Single Mode | | | | | | | |
|---|---|---|---|---|---|---|---|---|---|---|---|---|
| selPfet | C1 | C2 | S0P | S0N | P0 | P1 | P2 | P3 | N0 | N1 | N2 | N3 |
| 0 | 0 | 0 | S0P | 0 | GND | S0 | S0 | S0P | S0N | GND | GND | GND |
| 0 | 0 | 1 | S0P | 0 | S0 | GND | S0 | S0P | GND | S0N | GND | GND |
| 0 | 1 | 0 | S0P | 0 | S0 | S0 | GND | S0P | GND | GND | S0N | GND |
| 0 | 1 | 1 | S0P | 0 | S0 | S0 | S0 | GND | GND | GND | GND | S0N |
| 1 | 0 | 0 | 0 | S0N | GND | S0 | S0 | S0P | S0N | GND | GND | GND |
| 1 | 0 | 1 | 0 | S0N | S0 | GND | S0 | S0P | GND | S0N | GND | GND |
| 1 | 1 | 0 | 0 | S0N | S0 | S0 | GND | S0P | GND | GND | S0N | GND |
| 1 | 1 | 1 | 0 | S0N | S0 | S0 | S0 | GND | GND | GND | GND | S0N |

The SPM is also configurable to separately control the DUT 170 and 180 gate voltages. Dual supply mode testing enables threshold voltage, $V_t$, measurement capability, in addition to $I_{ON}$ measurement capability. In dual supply mode, effective current ($I_{eff}$) can be calculated. $I_{eff}$ is a better indicator of device performance than $I_{ON}$ alone. To implement dual supply mode a dedicated pad, S1, must be wired out. S1 is shown in FIG. 3 as LN and HP respectively.

Table 3 shows an example truth table for dual supply mode.

TABLE 3

Example truth table for dual supply mode

| Input | | | | | Dual Mode | | | | | | | |
|---|---|---|---|---|---|---|---|---|---|---|---|---|
| selPfet | C1 | C2 | S0P | S0N | P0 | P1 | P2 | P3 | N0 | N1 | N2 | N3 |
| 0 | 0 | 0 | S0P | 0 | S1 | S0P | S0P | S0P | S1 | GND | GND | GND |
| 0 | 0 | 1 | S0P | 0 | S0P | S1 | S0P | S0P | GND | S1 | GND | GND |

TABLE 3-continued

Example truth table for dual supply mode

| Input | | | | | Dual Mode | | | | | | | |
|---|---|---|---|---|---|---|---|---|---|---|---|---|
| selPfet | C1 | C2 | S0P | S0N | P0 | P1 | P2 | P3 | N0 | N1 | N2 | N3 |
| 0 | 1 | 0 | S0P | 0 | S0P | S0P | S1 | S0P | GND | GND | S1 | GND |
| 0 | 1 | 1 | S0P | 0 | S0P | S0P | S0P | S1 | GND | GND | GND | S1 |
| 1 | 0 | 0 | 0 | S0N | S1 | S0P | S0P | S0P | S1 | GND | GND | GND |
| 1 | 0 | 1 | 0 | S0N | S0P | S1 | S0P | S0P | GND | S1 | GND | GND |
| 1 | 1 | 0 | 0 | S0N | S0P | S0P | S1 | S0P | GND | GND | S1 | GND |
| 1 | 1 | 1 | 0 | S0N | S0P | S0P | S0P | S1 | GND | GND | GND | S1 |

The SPM may be placed in various locations within an ASIC design to test different areas of the same chip. Alternative DUT structures may also be incorporated into the design such that each SPM is able to test a particular DUT structure in proximity to it. A single SPM may also be designed to test multiple varieties of DUT structures, such as wires, resistors, capacitors, inductors, etc., within a specific chip location.

The above description and drawings are only to be considered illustrative of exemplary embodiments, which achieve the features and advantages of the invention. It should be appreciated by one of ordinary skill in the art that modification and substitutions to specific layout designs, systems for performing the tests and analysis, and the devices themselves can be made without departing from the spirit and scope of the invention. Accordingly, the invention is not to be considered as being limited by the foregoing description and drawings.

What is claimed is:

1. A test system for acquiring parametric data within an integrated circuit comprising:
   a plurality of device under test (DUT) structures;
   a macro for conducting testing of the DUT structures;
   the macro comprising:
   a logic controller having a decoder which activates at least one DUT structure;
   a decode level translator which provides a required gate voltage to one or more of the DUT structures;
   at least one supply/protect/isolation (SPI) circuit which comprises:
   a supply circuit which provides a source voltage to the DUT structures;
   an isolation circuit which controls the supply circuit to isolate each of the DUT structures during test; and
   a protect circuit which protects the supply circuit from leakage current when the test system is inactive; and
   an SPI control circuit which enables or disables the SPI circuit.

2. The test system of claim 1, wherein the DUT structures are replicas of a plurality of device structures which form the integrated circuit.

3. The DUT structures of claim 2, wherein a portion of the DUT structures are nFET DUT structures and a portion of the DUT structures are pFET DUT structures.

4. The test system of claim 2, wherein the DUT structures comprise at least one electronic circuit component from the group consisting of resistors, capacitors, wires, and inductors.

5. The test system of claim 3, wherein the decode level translator comprises a pFET level translator and an nFET level translator; the decode level translator receives control input from a decoder.

6. The test system of claim 5, wherein the decoder is at least a 2:4 decoder.

7. The test system of claim 5, wherein a test is performed using a single voltage supply input to the pFET level translator and the nFET level translator.

8. The test system of claim 5, wherein a test is performed using a dual voltage supply input to the pFET level translator and the nFET level translator.

9. The pFET level translator of claim 5, comprising a plurality of pFET devices, a plurality of nFET devices, and at least one inverter and is configured such that the gate voltage of the corresponding pFET DUT structure is activated when the pFET level translator is enabled.

10. The nFET level translator of claim 5, comprising a plurality of pFET devices, a plurality of nFET devices, and at least one inverter and is configured such that the gate voltage of the corresponding nFET DUT structure is activated when the nFET level translator is enabled.

11. The test system of claim 1, wherein the system is integrated into an electronic chip identification (ECID) circuit.

12. The test system of claim 1, wherein the macro is a stand alone macro.

13. The test system of claim 1, wherein the DUT structures are located in a backfill area of the integrated circuit.

14. The integrated circuit of claim 1, wherein the integrated circuit comprises a plurality of the macros interspersed throughout the circuit.

15. The integrated circuit of claim 14, wherein each of the plurality of macros is configured to test one of a plurality of associated DUT structures.

16. The test system of claim 1, wherein a plurality of parametric tests is used in the testing of the DUT structures; the plurality of tests is specified by a user.

17. The test system of claim 1, wherein the health of a manufacturing line (HOL) is determined by comparing the data to a plurality of required product specifications.

18. The test system of claim 17, wherein at least one process in the manufacturing line is changed to satisfy at least one of the product specifications.

19. The test system of claim 1, wherein the supply circuit comprises a pFET.

20. The test system of claim 1, wherein the protect circuit comprises at least one control signal to disable the SPM macro.

* * * * *